United States Patent
Kim

(10) Patent No.: US 9,531,362 B1
(45) Date of Patent: Dec. 27, 2016

(54) SEMICONDUCTOR DEVICE INCLUDING DELAY CIRCUIT AND OPERATING METHOD THEREOF

(71) Applicant: SK hynix Inc., Gyeonggi-do (KR)

(72) Inventor: Chang-Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/962,122

(22) Filed: Dec. 8, 2015

(30) Foreign Application Priority Data

Jun. 19, 2015 (KR) ........................ 10-2015-0087250

(51) Int. Cl.
*H03K 5/13* (2014.01)
*H03K 5/00* (2006.01)

(52) U.S. Cl.
CPC ..... *H03K 5/133* (2013.01); *H03K 2005/00058* (2013.01)

(58) Field of Classification Search
USPC ......................... 327/261–264, 276, 278, 285
See application file for complete search history.

(56) References Cited

U.S. PATENT DOCUMENTS 8,742,815 B2 * 6/2014 Wadhwa .......... H03K 3/356104
327/262
9,281,828 B2 * 3/2016 Kargar .................... H03L 7/087

FOREIGN PATENT DOCUMENTS

KR 1020110076136 7/2011
KR 1020130072051 7/2013

* cited by examiner

*Primary Examiner* — An Luu
(74) *Attorney, Agent, or Firm* — IP & T Group LLP

(57) ABSTRACT

A semiconductor device includes a calibration code generation circuit suitable for generating a calibration code by adjusting a period of a short-term oscillation signal oscillating at a period less than a reference period, based on a reference oscillation signal oscillating at the reference period; and a delay circuit suitable for setting a delay value based on the calibration code.

20 Claims, 15 Drawing Sheets

SEMICONDUCTOR DEVICE INCLUDING DELAY CIRCUIT AND OPERATING METHOD THEREOF

CROSS-REFERENCE TO RELATED APPLICATIONS

The present application claims priority of Korean Patent Application No. 10-2015-0087250, filed on Jun. 19, 2015, which is incorporated herein by reference in its entirety.

BACKGROUND

1. Field

Exemplary embodiments of the present invention relate to a semiconductor design technology, and more particularly, to a semiconductor device including a delay circuit.

2. Description of the Related Art

Delay circuits are included in a semiconductor device using an inverter chain in which inverters coupled in series or using a resistor-capacitor (RC) delay circuit. The inverter chain delays a signal by using gate delays (i.e., transmission delays) of transistors forming the inverters. The characteristics of the transistors in the semiconductor device are changed by Process/Voltage/Temperature (PVT) variation. Furthermore, the transistors arranged in the semiconductor device may show undesired characteristics due to a difference between gate patterning processes of the respective transistors or a difference in dose between implantation processes for determining a threshold voltage. In this case, the performance of semiconductor products may be degraded.

Since the RC delay circuit exhibits a smaller skew variation for the PVT variation than the inverter chain implemented with gate delays, the RC delay circuit is used in various circuits. A long-RC delay circuit having a large delay amount exhibits a small skew variation. On the other hand, a short-RC delay circuit having a small delay amount exhibits a skew variation greater than that of the long-RC delay circuit. Thus, the use of the short-RC delay circuit is limited.

The long-RC delay circuit is also used to determine a refresh operation period in DRAMs. For example, a refresh cycle time tRFC used during a refresh operation may be set through the long-RC delay circuit having a considerably large delay amount. However, considering the efficiency of the circuit area of DRAMs, the short-RC delay circuit and a circuit using a counter may be used to set the refresh cycle time tRFC. Since an active operation period by the refresh operation is changed due to the PVT variation, the retention time of DRAM cells may be changed, which makes it difficult to manage the refresh characteristic.

Thus, there is a demand for a short-RC delay circuit which has a less skew while exhibiting the efficiency of the circuit area of DRAMs.

SUMMARY

Various embodiments are directed to a semiconductor device which is capable of Implementing a short-RC delay circuit having a relatively less skew and a reduced circuit area.

In an embodiment, a semiconductor device may include a calibration code generation circuit suitable for generating a calibration code by adjusting a period of a short-term oscillation signal oscillating at a period less than a reference period, based on a reference oscillation signal oscillating at the reference period; and a delay circuit suitable for setting a delay value based on the calibration code.

In an embodiment, an operating method of a semiconductor device including a delay circuit may include generating a reference oscillation signal having a reference period; generating a short-term oscillation signal having a period less than the reference period; outputting a period control code and a calibration code based on the reference oscillation signal and the short-term oscillation signal; adjusting a period of the short-term oscillation signal based on the period control code; and setting a delay value of the delay circuit based on the calibration code.

DETAILED DESCRIPTION

Figure 1:
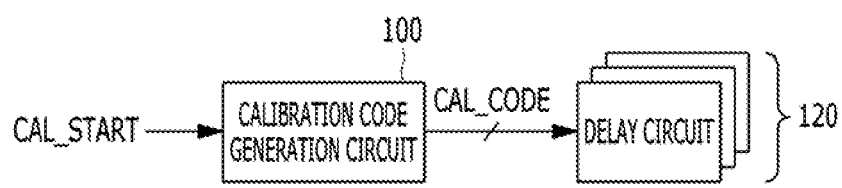
FIG. 1 is a block diagram illustrating a semiconductor device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated to clearly illustrate features of the embodiments. It is also noted that in this specification, "connected/coupled" refers to one component not only directly coupling another component, but also indirectly coupling another component through an Intermediate component. In addition, a singular form may include a plural form as long as it is not specifically mentioned.

FIG. 1 is a block diagram illustrating a semiconductor device in accordance with an embodiment of the present invention.

Referring to FIG. 1, the semiconductor device in accordance with the embodiment of the present invention may include a calibration code generation circuit 100 and a plurality of delay circuits 120.

The calibration code generation circuit 100 may generate a calibration code CAL_CODE by adjusting a period of a short-term oscillation signal based on a reference oscillation signal, in response to a calibration start signal CAL_START. The reference oscillation signal may oscillate at a reference period, and the short-term oscillation signal may oscillate at a period less than the reference period. The delay circuits 120 may set internal delay values in response to the calibration code CAL_CODE. Each of the delay circuits 120 may include an RC delay.

Figure 2:
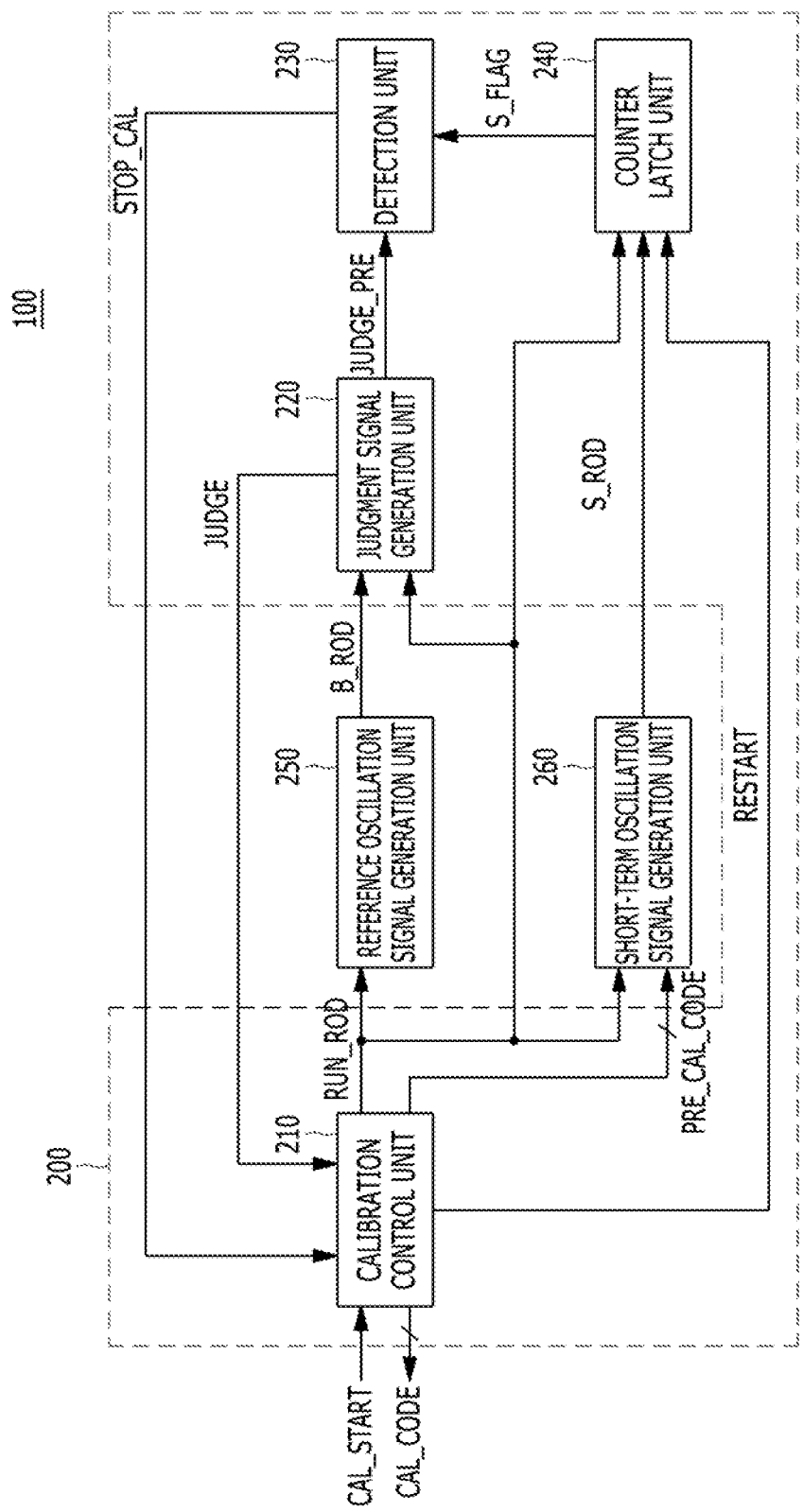
FIG. 2 is a detailed diagram of a calibration code generation circuit shown in FIG. 1.

FIG. 2 is a detailed diagram of the calibration code generation circuit 100 shown in FIG. 1.

Referring to FIG. 2, the calibration code generation circuit 100 may include a calibration operation adjust unit 200, a reference oscillation signal generation unit 250, and a short-term oscillation signal generation unit 260.

The reference oscillation signal generation unit 250 may generate a reference oscillation signal B_ROD. The short-term oscillation signal generation unit 260 may generate a short-term oscillation signal S_ROD, and adjust a period of the short-term oscillation signal S_ROD in response to a period control code PRE_CAL_CODE. Each of the reference oscillation signal generation unit 250 and the short-term oscillation signal generation unit 260 may include a ring oscillator delay (ROD).

The calibration operation adjust unit 200 may output the period control code PRE_CAL_CODE or the calibration code CAL_CODE in response to the reference oscillation signal B_ROD and the short-term oscillation signal S_ROD. The calibration operation adjust unit 200 may output the period control code PRE_CAL_CODE to the short-term oscillation signal generation unit 260 when the reference period is greater than N times the period of the short-term oscillation signal S_ROD, and output the calibration code CAL_CODE to the delay circuits 120 shown in FIG. 1 when the reference period is less than or equal to N times the period of the short-term oscillation signal S_ROD, where N is a positive integer.

The calibration operation adjust unit 200 may include a calibration control unit 210, a judgment signal generation unit 220, a detection unit 230, and a counter latch unit 240.

The judgment signal generation unit 220 may generate a first judgment signal JUDGE_PRE which is activated at each reference period of the reference oscillation signal B_ROD, and generate a second judgment signal JUDGE by delaying the first judgment signal JUDGE_PRE.

The counter latch unit 240 may generate a count signal S_FLAG by counting the period of the short-term oscillation signal S_ROD.

The detection unit 230 may compare the first judgment signal JUDGE_PRE with the count signal S_FLAG, and output a detection signal STOP_CAL.

The calibration control unit 210 may output the period control code PRE_CAL_CODE and the calibration code CAL_CODE in response to the second judgment signal JUDGE and the detection signal STOP_CAL. The calibration control unit 210 may output a count reset signal RESTART for resetting the counter latch unit 240. Furthermore, the calibration control unit 210 may generate an operation start signal RUN_ROD for starting operations of the reference oscillation signal generation unit 250 and the short-term oscillation signal generation unit 260. The operation start signal RUN_ROD may be used for controlling operations of the judgment signal generation unit 220 and the counter latch unit 240.

Hereinafter, referring to FIGS. 3 to 8B, the components of the calibration code generation circuit 100 will be described. In the descriptions for the drawings, the description of a reset signal RSTB related to the operation of the entire semiconductor device is omitted.

Figure 3:
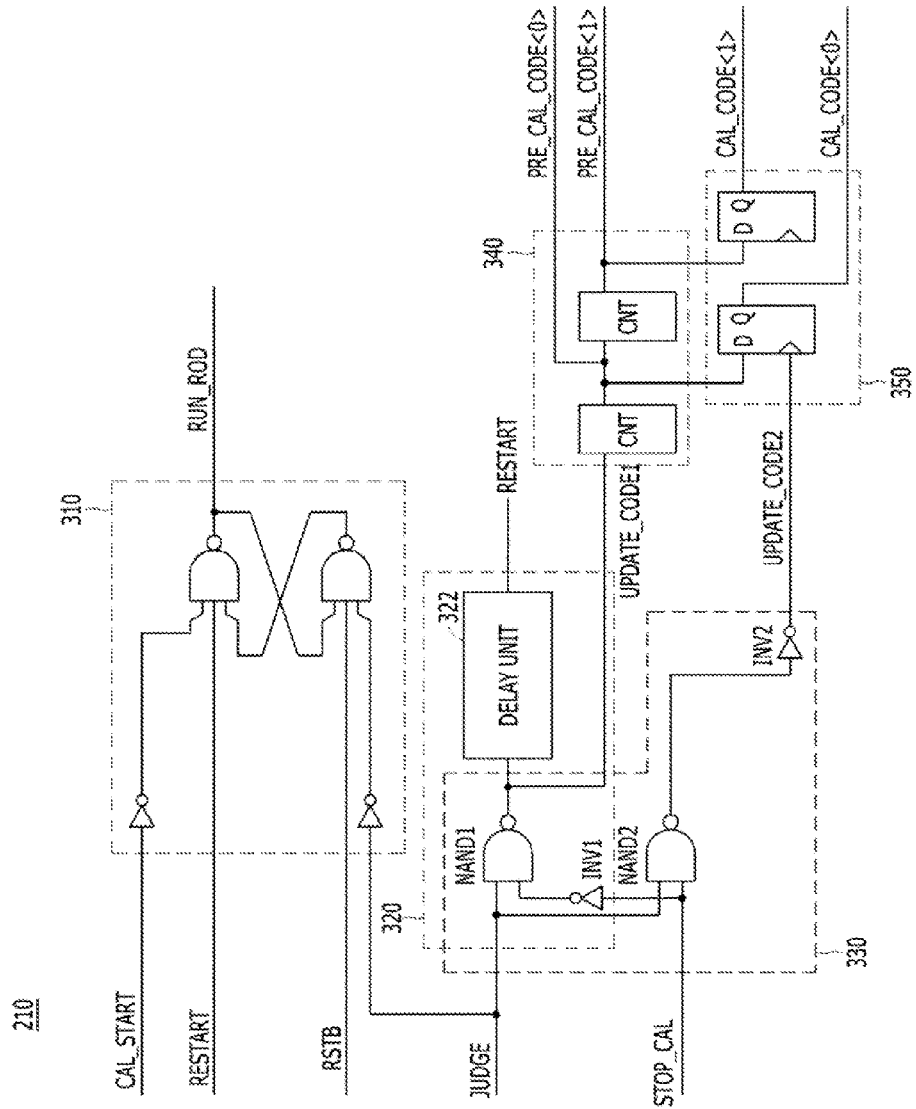
FIG. 3 is a detailed diagram of a calibration control unit shown in FIG. 2.

FIG. 3 is a detailed diagram of the calibration control unit 210 shown in FIG. 2.

Referring to FIG. 3, the calibration control unit 210 may include an operation start signal generation unit 310, a count reset signal generation unit 320, an update signal generation unit 330, a first code output unit 340, and a second code output unit 350.

The operation start signal generation unit 310 may generate the operation start signal RUN_ROD for starting the operations of the reference oscillation signal generation unit 250 and the short-term oscillation signal generation unit 260 shown in FIG. 2. The operation start signal generation unit 310 may activate the operation start signal RUN_ROD in response to the calibration start signal CAL_START and the count reset signal RESTART, and deactivate the operation start signal RUN_ROD in response to the second judgment signal JUDGE. In an embodiment, the operation start signal generation unit 310 may include an RS latch which receives the calibration start signal CAL_START and the count reset signal RESTART as set signals and receives the second judgment signal JUDGE as a reset signal. The RS latch may include a cross-coupled NAND latch.

The count reset signal generation unit 320 may generate the count reset signal RESTART for resetting the counter latch unit 240 shown in FIG. 2 at a predetermined time after the second judgment signal JUDGE is activated in a state where the detection signal STOP_CAL is deactivated. In an embodiment, the count reset signal generation unit 320 may include a first inverter INV1, a first NAND gate NAND1, and a delay unit 322. The first inverter INV1 may invert the detection signal STOP_CAL, the first NAND gate NAND1 may perform a NAND operation on an output of the first inverter INV1 and the second judgment signal JUDGE, and the delay unit 322 may delay an output of the first NAND gate NAND1 and output the count reset signal RESTART.

The update signal generation unit 330 may output the first update signal UPDATE_CODE1 when the second judgment signal JUDGE is activated in a state where the detection signal STOP_CAL is deactivated, and output the second update signal UPDATE_CODE2 when the second judgment signal JUDGE is activated in a state where the detection signal STOP_CAL is activated. In an embodiment, the update signal generation unit 330 may include the first inverter INV1, the first NAND gate NAND1, a second NAND gate NAND2, and a second inverter INV2. The first inverter INV1 may invert the detection signal STOP_CAL, the first NAND gate NAND1 may perform the NAND operation on the output of the first inverter INV1 and the second judgment signal JUDGE, and output a first update signal UPDATE_CODE1, and the second NAND gate NAND2 and the second inverter INV2 may perform an AND operation on the detection signal STOP_CAL and the second judgment signal JUDGE, and output a second update signal UPDATE_CODE2.

The first code output unit 340 may output the period control code PRE_CAL_CODE<0:1> in response to the first update signal UPDATE_CODE1. In an embodiment, the first code output unit 340 may include counters CNT for up-counting the period control code PRE_CAL_CODE<0:1> by one bit whenever the first update signal UPDATE_CODE1 is activated.

The second code output unit 350 may output the calibration code CAL_CODE<0:1> in response to the second update signal UPDATE_CODE2. In an embodiment, the second code output unit 350 may output the period control code PRE_CAL_CODE<0:1> which is finally generated, as the calibration code CAL_CODE<0:1> when the second update signal UPDATE_CODE2 is activated. The second code output unit 350 may include a plurality of flip-flops.

Figure 4:
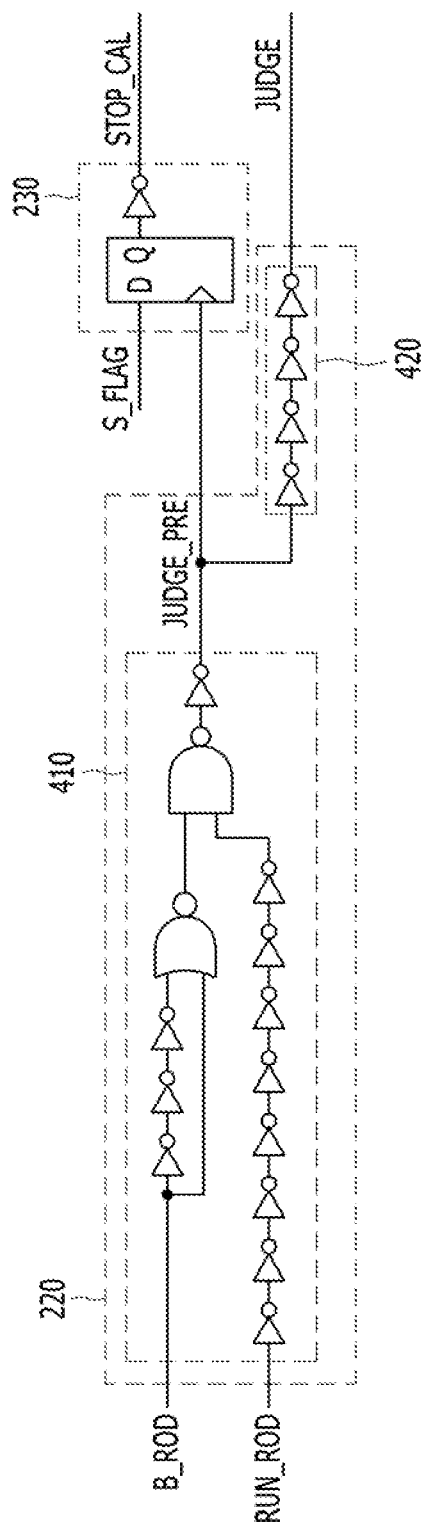
FIG. 4 is a detailed diagram of a judgment signal generation unit and a detection unit shown in FIG. 2.

FIG. 4 is a detailed diagram of the judgment signal generation unit 220 and the detection unit 230 shown in FIG. 2.

Referring to FIG. 4, the judgment signal generation unit 220 may include a first judgment signal generation unit 410 and a second judgment signal generation unit 420.

The first judgment signal generation unit 410 may generate a first judgment signal JUDGE_PRE which is activated at each reference period of the reference oscillation signal B_ROD. The second judgment signal generation unit 420 may generate a second judgment signal JUDGE by delaying the first judgment signal JUDGE_PRE.

In an embodiment, the first judgment signal generation unit 410 may include a logic circuit for generating the first judgment signal JUDGE_PRE as a pulse signal when the reference oscillation signal B_ROD transitions from a logic high level to a logic low level during an active period of the operation start signal RUN_ROD, and the second judgment signal generation unit 420 may include an inverter chain for delaying the first judgment signal JUDGE_PRE by a predetermined time.

The detection unit 230 may synchronize the count signal S_FLAG with the first judgment signal JUDGE_PRE and output the synchronized signal as the detection signal STOP_CAL. In an embodiment, the detection unit 230 may include a flip-flop and an inverter configured to invert an output of the flip-flop and output the inverted signal as the detection signal STOP_CAL.

Figure 5:
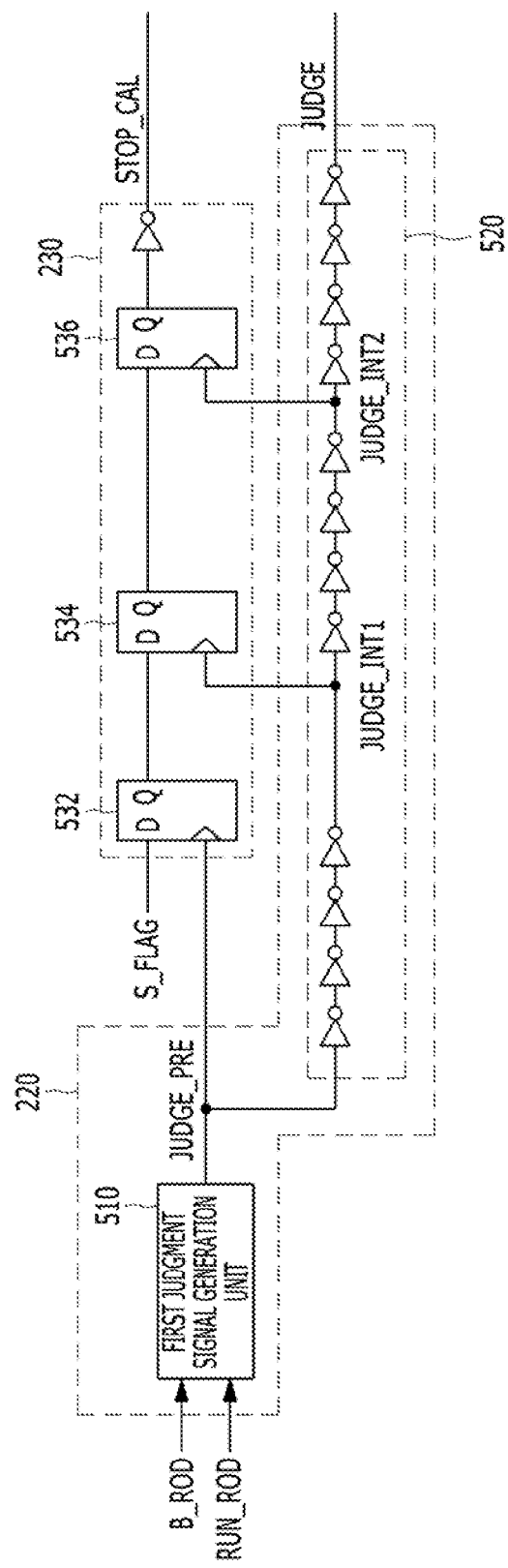
FIG. 5 is a detailed diagram of the judgment signal generation unit and the detection unit shown in FIG. 2.

FIG. 5 is another detailed diagram of the judgment signal generation unit 220 and the detection unit 230 shown in FIG. 2.

Referring to FIG. 5, the judgment signal generation unit 220 may include a first judgment signal generation unit 510 and a second judgment signal generation unit 520.

The first judgment signal generation unit 510 may have substantially the same configuration as the first judgment signal generation unit 410 illustrated in FIG. 4. The second judgment signal generation unit 520 may sequentially delay a first judgment signal JUDGE_PRE outputted from the first judgment signal generation unit 510, and generate two or more intermediate signals JUDGE_INT1 and JUDGE_INT2. Then, the second judgment signal generation unit 520 may generate a second judgment signal JUDGE by delaying the final signal JUDGE_INT2 among the intermediate signals.

The detection unit 230 may include a plurality of flip-flops coupled in series to each other and an inverter. For example, the detection unit 230 may include a first flip-flop 532 and two or more second flip-flops 534 and 536. The first flip-flop 532 may output the count signal S_FLAG in synchronization with the first judgment signal JUDGE_PRE, and the two or more second flip-flops 534 and 536 may sequentially transmit the output of the first flip-flop 532 in synchronization with the two or more intermediate signals JUDGE_INT1 and JUDGE_INT2, and output the detection signal STOP_CAL.

The detection unit 230 illustrated in FIG. 5 may register a plurality of spots at which the count signal S_FLAG and the first judgment signal JUDGE_PRE meet each other, and prepare for metastability based on a timing difference between the count signal S_FLAG and the first judgment signal JUDG_PRE.

Figure 6:
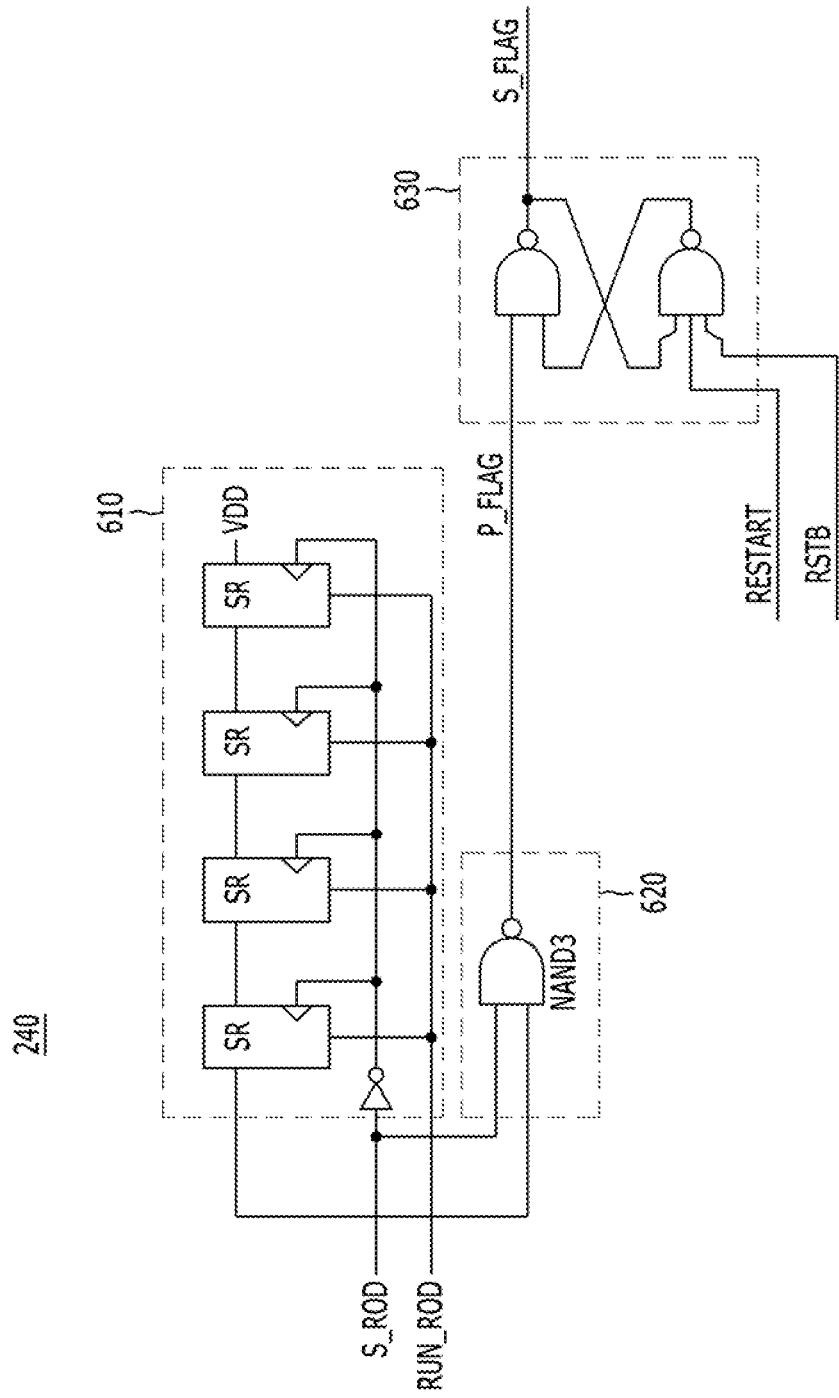
FIG. 6 is a detailed diagram of a counter latch unit shown in FIG. 2.

FIG. 6 is a detailed diagram of the counter latch unit 240 shown in FIG. 2.

Referring to FIG. 6, the counter latch unit 240 may include a counter 610, a transmission unit 620, and a latch unit 630.

The counter 610 may count the period of the short-term oscillation signal S_ROD. In an embodiment, the counter 610 may include a plurality of shift registers SR coupled in series. The shift registers may sequentially transmit a high-level signal VDD in response to low edges of the short-term oscillation signal S_ROD. The shift registers may be reset in response to the operation start signal RUN_ROD.

The transmission unit 620 may output the short-term oscillation signal S_ROD as an output signal P_FLAG when the counting value reaches a predetermined value. In an embodiment, the transmission unit 620 may include a NAND gate NAND3 which performs a NAND operation on an output signal of the counter 610 and the short-term oscillation signal S_ROD.

The latch unit 630 may output the count signal S_FLAG which is set by the output signal P_FLAG and reset in response to the count reset signal RESTART. In an embodiment, the latch unit 630 may include an RS latch which receives the output signal P_FLAG as a set signal and receives the count reset signal RESTART as a reset signal. The RS latch may include a cross-coupled NAND latch.

Figure 7A:
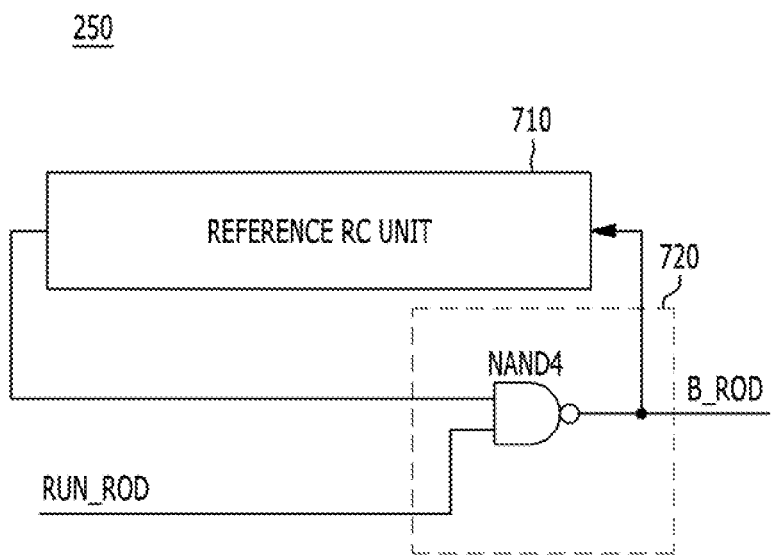
FIGS. 7A and 7B are detailed diagrams of a reference oscillation signal generation unit shown in FIG. 2.
Figure 7B:
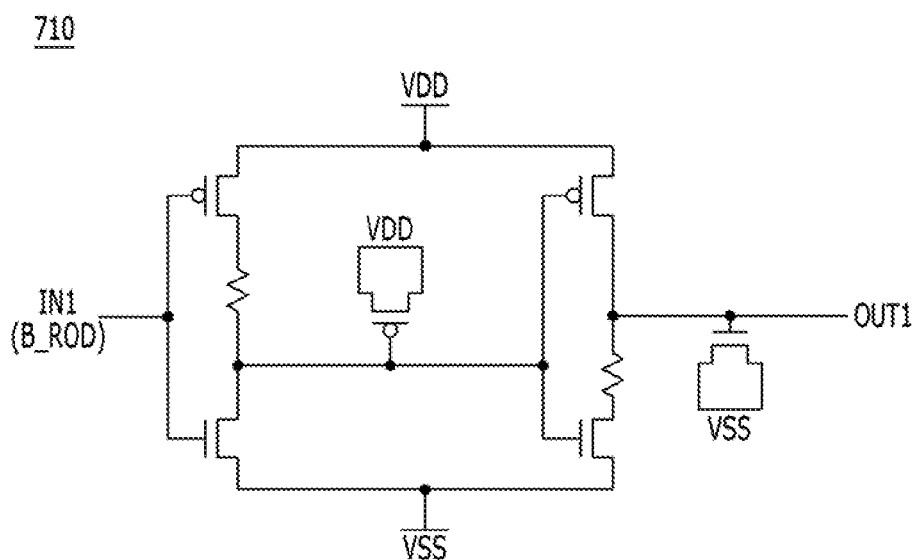

FIG. 7A is a detailed diagram of the reference oscillation signal generation unit 250 shown in FIG. 2, and FIG. 7B is a detailed diagram of a reference RC unit 710 shown in FIG. 7A.

Referring to FIG. 7A, the reference oscillation signal generation unit 250 may include the reference RC unit 710 and a first output unit 720.

The reference RC unit 710 may have a relatively lesser skew variation for PVT variation, and output an input signal as an output signal having a relatively constant period. The first output unit 720 may selectively output the output signal of the reference RC unit 710 as the reference oscillation signal B_ROD in response to the operation start signal RUN_ROD. In an embodiment, the first output unit 720 may include a NAND gate NAND4 which performs a NAND operation on the operation start signal RUN_ROD and the output signal of the reference RC unit 710.

Referring to FIG. 7B, the reference RC unit 710 may delay an input signal IN1 by a time corresponding to a fixed RC delay value, and output the delayed signal as an output signal OUT1. Since the reference RC unit 710 has a relatively lesser skew variation for the PVT variation, the input signal IN1 may be outputted as the output signal OUT1 having a relatively lesser skew variation.

Thus, the reference oscillation signal generation unit 250 may output the reference oscillation signal B_ROD which has a relatively lesser skew variation for the PVT variation and oscillates at the reference period.

Figure 8A:
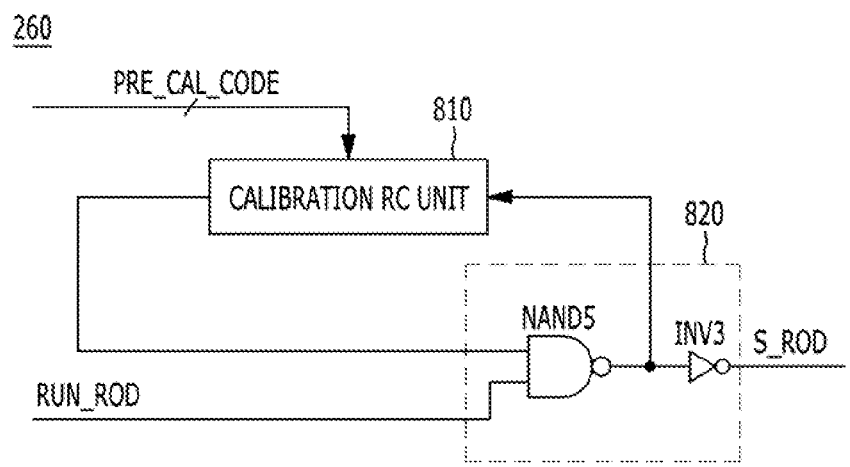
FIGS. 8A and 8B are detailed diagrams of a short-term oscillation signal generation unit shown in FIG. 2.
Figure 8B:
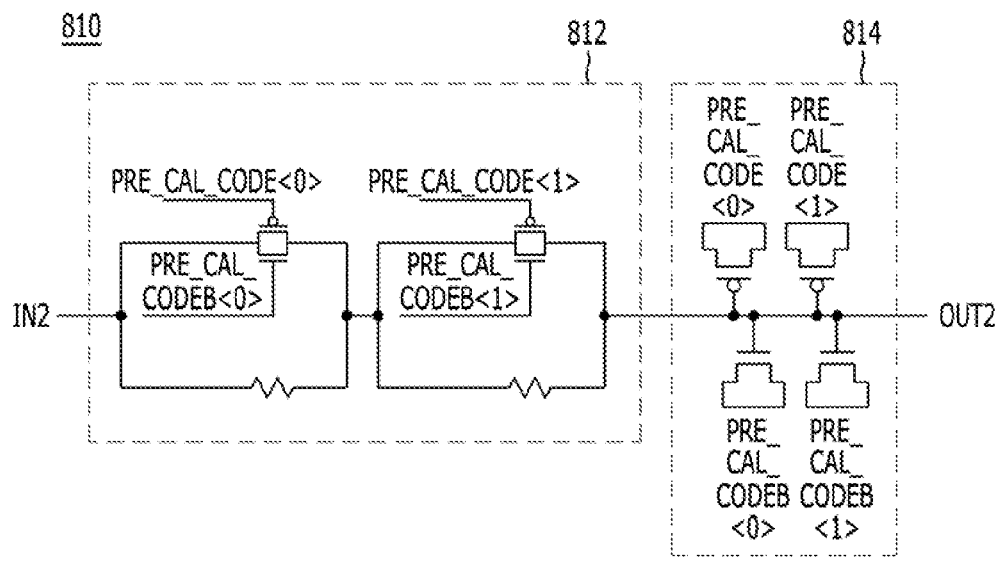

FIG. 8A is a detailed diagram of the short-term oscillation signal generation unit 260 shown in FIG. 2, and FIG. 8B is a detailed diagram of a calibration RC unit 810 shown in FIG. 8A.

Referring to FIG. 8A, the short-term oscillation signal generation unit 260 may include the calibration RC unit 810 and a second output unit 820.

The calibration RC unit 810 may calibrate the period of the input signal in response to the period control code PRE_CAL_CODE, and output an output signal having the calibrated period.

The second output unit 820 may selectively output the output signal of the calibration RC unit 810 as the short-term oscillation signal B_ROD in response to the operation start signal RUN_ROD. In an embodiment, the second output unit 820 may include a NAND gate NAND5 and an inverter INV3, which perform an AND operation on the operation start signal RUN_ROD and the output signal of the reference RC unit 810.

Referring to FIG. 8B, the calibration RC unit 810 may include a first calibration unit 812 and a second calibration unit 814. The first calibration unit 812 may calibrate the resistance value of a transmission node of the input signal IN2 in response to the period control code PRE_CAL_CODE<0:1>, and the second calibration unit 814 may calibrate the capacitance of the transmission node of the input signal IN2 in response to the period control code PRE_CAL_CODE<0:1>. In an embodiment, as calibration is started to sequentially generate the period control code PRE_CAL_CODE<0:1> as "00"→"01"→"10"→"11", the RC delay value of the calibration RC unit 810 may gradually increase. That is, as the RC delay value of the calibration RC unit 810 is gradually increased to generate an optimal calibration code, the calibration time may be reduced.

Hereafter, referring to FIGS. 3 to 9B, an operation of the calibration code generation circuit 100 will be described.

Figure 9A:
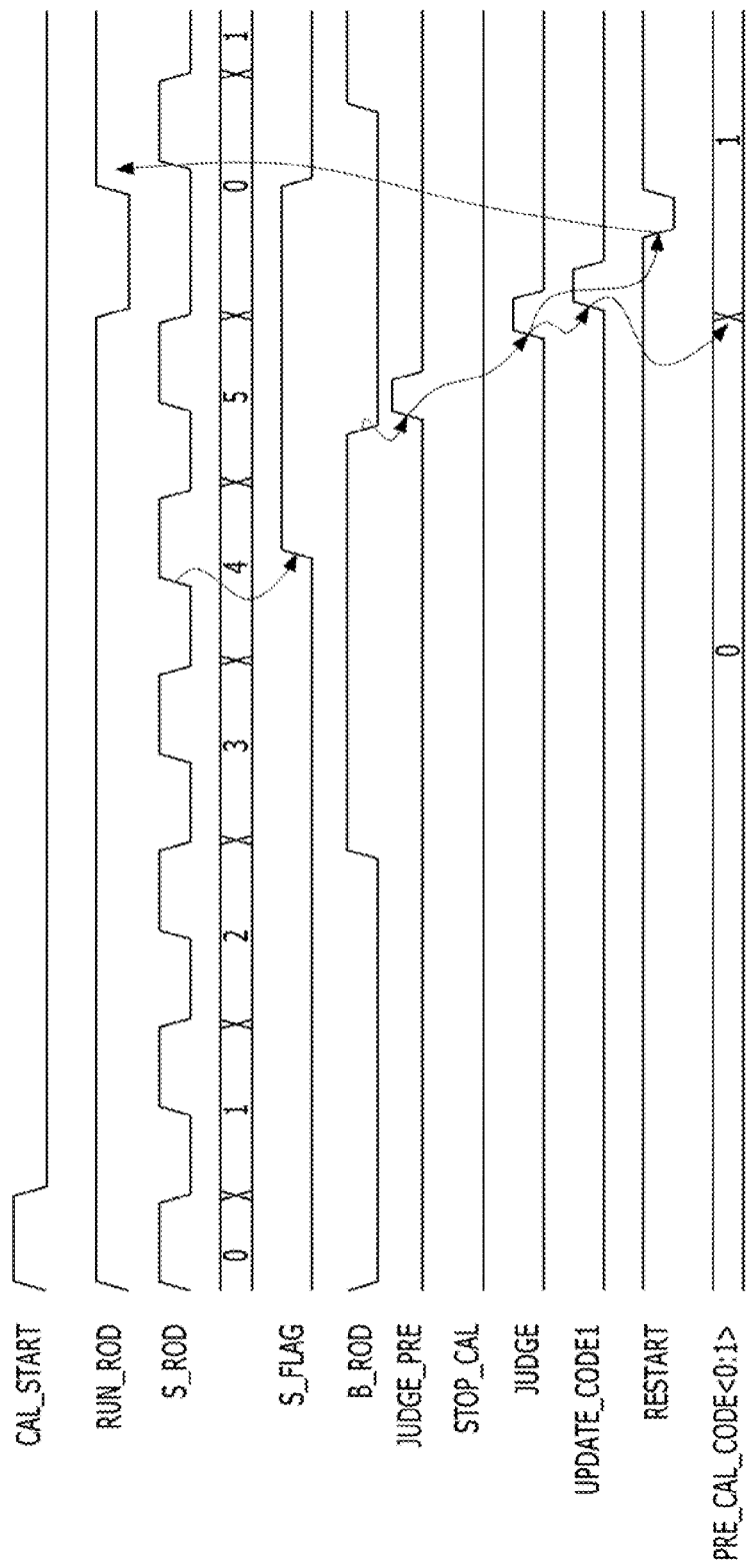
FIGS. 9A and 9B are waveform diagrams for describing an operation of the calibration code generation circuit shown in FIG. 2.
Figure 9B:
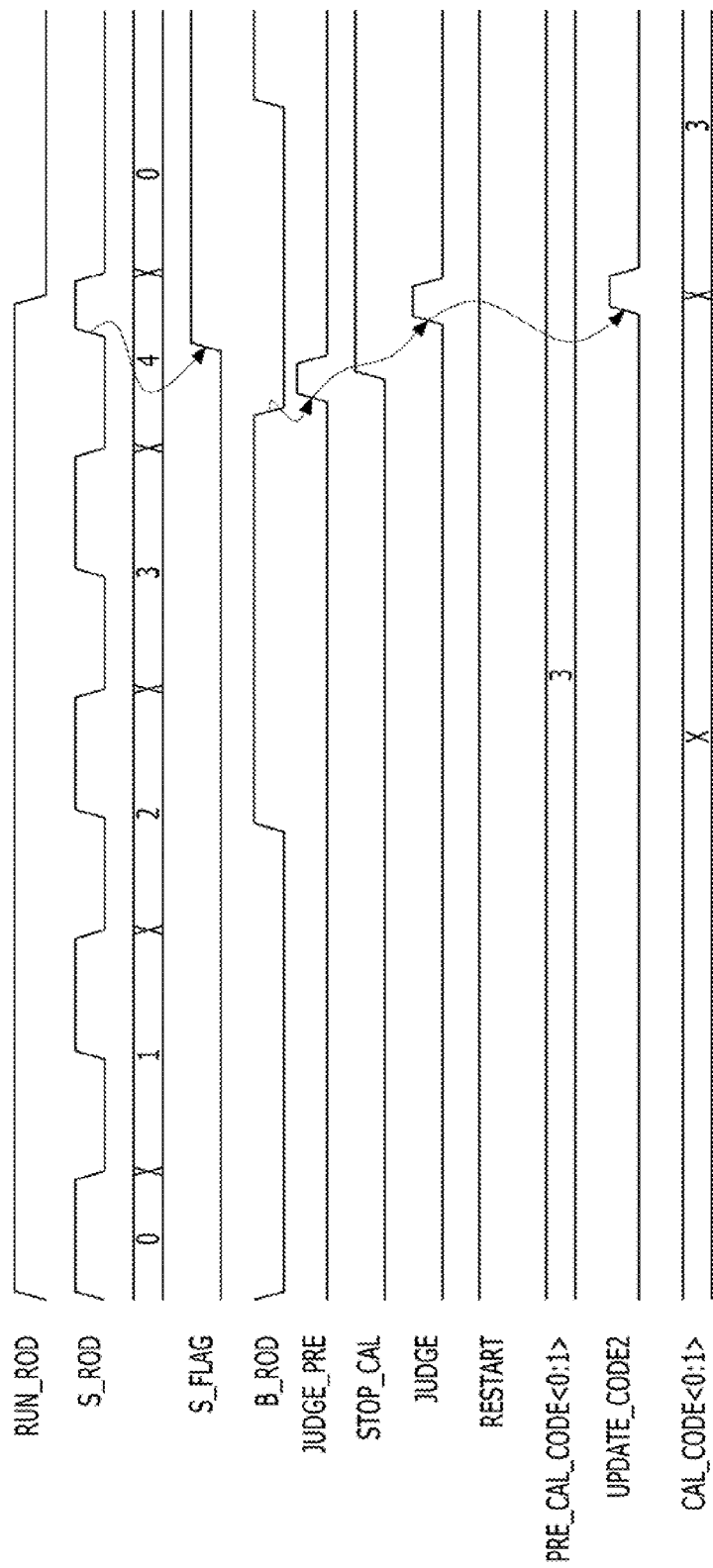

FIGS. 9A and 9B are waveform diagrams for describing an operation of the calibration code generation circuit 100 illustrated in FIG. 2. FIG. 9A illustrates that the reference period of the reference oscillation signal B_ROD is greater than the quadruple of the period of the short-term oscillation signal S_ROD, and FIG. 9B illustrates that the reference period is less than the quadruple of the period of the short-term oscillation signal S_ROD.

Referring to FIG. 9A, when the calibration start signal CAL_START is activated, the operation start signal generation unit 310 of the calibration control unit 210 may activate the operation start signal RUN_ROD for starting the operations of the reference oscillation signal generation unit 250 and the short-term oscillation signal generation unit 260. In response to the operation start signal RUN_ROD, the reference oscillation signal generation unit 250 may output the reference oscillation signal B_ROD which oscillates at the reference period, and the short-term oscillation signal generation unit 260 may output the short-term oscillation signal S_ROD which oscillates at a period less than the reference period.

The judgment signal generation unit 220 may generate a pre-Judgment signal JUDGE_PRE which is activated at each reference period of the reference oscillation signal B_ROD, and generate a judgment signal JUDGE by delaying the pre-judgment signal JUDGE_PRE. Furthermore, the counter latch unit 240 may generate the count signal S_FLAG by counting the period of the short-term oscillation signal S_ROD. For example, when the value obtained by counting the period of the short-term oscillation signal R_ROD reaches four, the counter latch unit 240 may output the count signal S_FLAG in synchronization with the short-term oscillation signal S_ROD which becomes a logic high level.

The detection unit 230 may synchronize the count signal S_FLAG with the first judgment signal JUDGE_PRE, and output the synchronized signal as the detection signal STOP_CAL. In FIG. 9A, when the first judgment signal JUDGE_PRE toggles to a logic high level, the count signal S_FLAG may transition to a logic high level. Thus, the detection unit 230 may finally output the detection signal STOP_CAL at a logic low level.

Then, when the second judgment signal JUDGE is activated to a logic high level in a state where the detection signal STOP_CAL is deactivated to a logic low level, the update signal generation unit 330 of the calibration control unit 210 may activate the first update signal UPDATE_CODE1. The operation start signal RUN_ROD may be deactivated in response to the second judgment signal JUDGE. Thus, the counter latch unit 240 may stop the counting operation. In response to the first update signal UPDATE_CODE1, the first code output unit 340 of the calibration control unit 210 may output the period control code PRE_CAL_CODE<0:1>. Thus, the short-term oscillation signal generation unit 260 may adjust the period of the short-term oscillation signal S_ROD.

When a predetermined time elapses after the first update signal UPDATE_CODE1 is activated, the count reset signal generation unit 320 of the calibration control unit 210 may activate the count reset signal RESTART to a logic low level. Thus, the operation start signal RUN_ROD may be reactivated. The above-described process may be repeated until the reference period of the reference oscillation signal B_ROD becomes less than or equal to the quadruple of the period of the short-term oscillation signal S_ROD.

Referring to FIG. 9B, in response to the operation start signal RUN_ROD, the reference oscillation signal generation unit 250 may output the reference oscillation signal B_ROD which oscillates at the reference period, and the short-term oscillation signal generation unit 260 may output the short-term oscillation signal S_ROD which oscillates at a period less than the reference period.

The judgment signal generation unit 220 may generate the pre-judgment signal JUDGE_PRE which is activated at each reference period of the reference oscillation signal B_ROD, and generate the Judgment signal JUDGE by delaying the pre-Judgment signal JUDGE_PRE. The counter latch unit 240 may generate the count signal S_FLAG by counting the period of the short-term oscillation signal S_ROD. For example, when the value obtained by counting the period of the short-term oscillation signal R_ROD reaches four, the counter latch unit 240 may output the count signal S_FLAG in synchronization with the short-term oscillation signal S_ROD which becomes a logic high level.

The detection unit 230 may synchronize the count signal S_FLAG with the first judgment signal JUDGE_PRE and output the synchronized signal as the detection signal STOP_CAL. In FIG. 9B, when the first judgment signal JUDGE_PRE toggles to a logic high level, the detection unit 230 may finally output the detection signal STOP_CAL to a logic high level, because the count signal S_FLAG already transitions to a logic low level.

Then, when the second judgment signal JUDGE is activated to a logic high level in a state where the detection signal STOP_CAL is activated to a logic high level, the update signal generation unit 330 of the calibration control unit 210 may activate the second update signal UPDATE_CODE2. The operation start signal RUN_ROD may be deactivated in response to the second judgment signal JUDGE. Thus, the counter latch unit 240 may stop the counting operation. The second code output unit 350 of the calibration control unit 210 may output the period control code PRE_CAL_CODE<0:1>, which is finally generated, as the calibration code CAL_CODE<0:1> in response to the second update signal UPDATE_CODE2.

Using the calibration code CAL_CODE<0:1> outputted through the above-described process, the delay circuits 120 may set the internal delay values.

Figure 10:
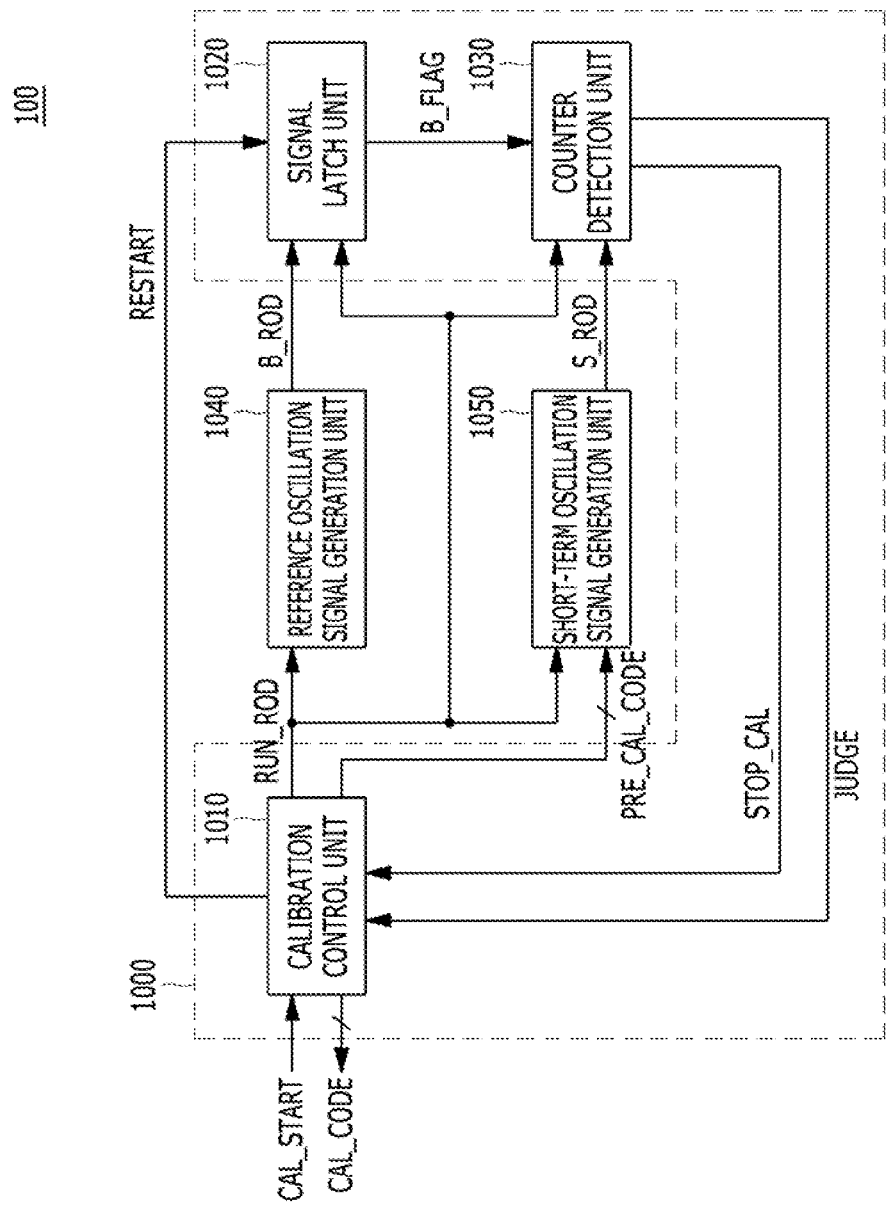
FIG. 10 is a detailed diagram of the calibration code generation circuit shown in FIG. 1.

FIG. 10 is another detailed diagram of the calibration code generation circuit 100. Hereafter, the same components as those of the embodiment illustrated in FIG. 2 will be briefly described.

Referring to FIG. 10, the calibration code generation circuit 100 may include a calibration operation adjust unit 1000, a reference oscillation signal generation unit 1040, and a short-term oscillation signal generation unit 1050.

The reference oscillation signal generation unit 1040 may generate a reference oscillation signal B_ROD. The short-term oscillation signal generation unit 1050 may generate a short-term oscillation signal S_ROD and adjust a period of the short-term oscillation signal S_ROD in response to a period control code PRE_CAL_CODE.

The calibration operation adjust unit 1000 may output the period control code PRE_CAL_CODE and the calibration code CAL_CODE in response to the reference oscillation signal B_ROD and the short-term oscillation signal S_ROD. The calibration operation adjust unit 1000 may generate the period control code PRE_CAL_CODE and output the period control code PRE_CAL_CODE to the short-term oscillation signal generation unit 1050 when the reference period is greater than N times the period of the short-term oscillation signal S_ROD, and generate the calibration code CAL_CODE and output the calibration code CAL_CODE to the delay circuits 120 shown in FIG. 1 when the reference period is less than or equal to N times the period of the short-term oscillation signal S_ROD.

The calibration operation adjust unit 1000 may include a calibration control unit 1010, a signal latch unit 1020, and a counter detection unit 1030.

The signal latch unit 1020 may generate a flag signal B_FLAG which is activated at each reference period of the reference oscillation signal B_ROD.

The counter detection unit 1030 may count the period of the short-term oscillation signal S_ROD, and activate the first judgment signal JUDGE_PRE when the counting value reaches a predetermined value. Furthermore, the counter detection unit 1030 may activate a second judgment signal JUDGE by delaying the first judgment signal JUDGE_PRE by a predetermined time, and output a detection signal STOP_CAL in response to the second judgment signal JUDGE and the flag signal B_FLAG.

The calibration control unit 1010 may output the period control code PRE_CAL_CODE and the calibration code CAL_CODE in response to the second judgment signal JUDGE and the detection signal STOP_CAL. The calibration control unit 1010 may output a signal reset signal RESTART for resetting the signal latch unit 1020. Furthermore, the calibration control unit 1010 may generate an operation start signal RUN_ROD for starting the operations of the reference oscillation signal generation unit 1040 and the short-term oscillation signal generation unit 1050. The operation start signal RUN_ROD may also be used for controlling the operations of the signal latch unit 1020 and the counter detection unit 1030.

Since the calibration control unit 1010, the reference oscillation signal generation unit 1040, and the short-term oscillation signal generation unit 1050 have substantially the same configuration as the calibration control unit 210, the reference oscillation signal generation unit 250, and the short-term oscillation signal generation unit 260, the detailed descriptions thereof are omitted herein.

Figure 11:
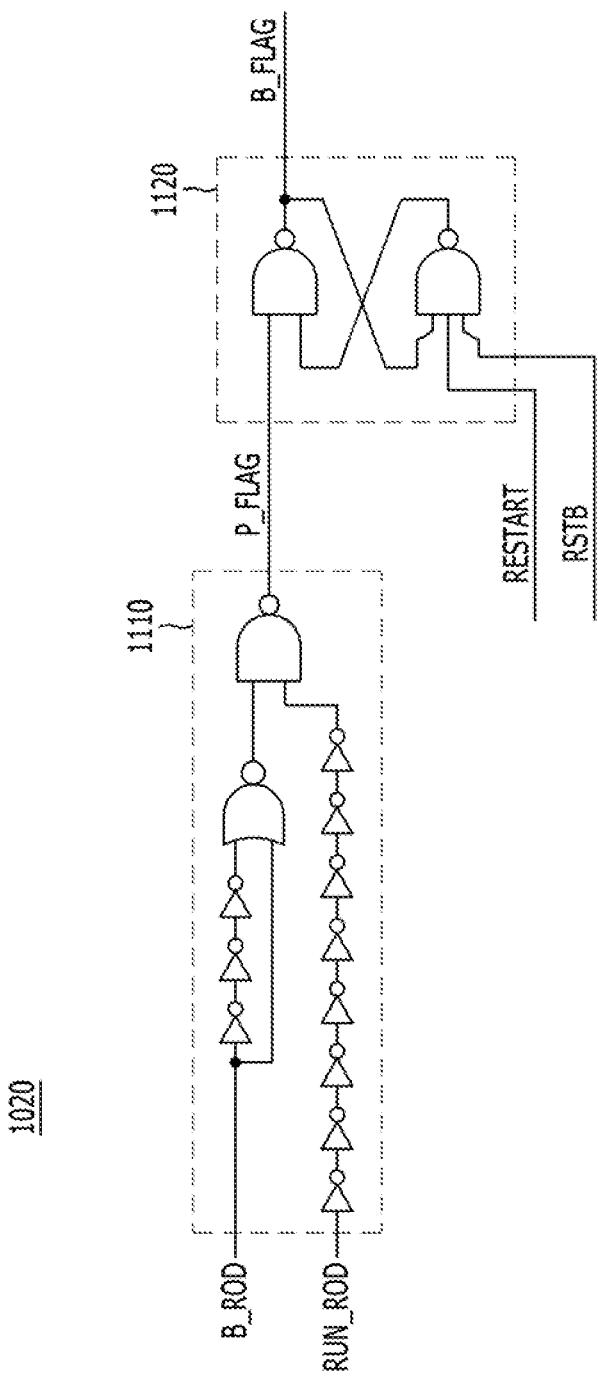
FIG. 11 is a detailed diagram of a signal latch unit shown in FIG. 10.

FIG. 11 is a detailed diagram of the signal latch unit 1020 shown in FIG. 10.

Referring to FIG. 11, the signal latch unit 1020 may include a first flag signal generation unit 1110 and a second flag signal generation unit 1120.

The first flag signal generation unit 1110 may generate a pre-flag signal P_FLAG which is activated at each reference period of the reference oscillation signal B_ROD.

The second flag signal generation unit 1120 may output a flag signal B_FLAG which is set by the pre-flag signal P_FLAG and reset in response to the signal reset signal RESTART. In an embodiment, the second flag signal generation unit 1120 may include an RS latch which receives the pre-flag signal P_FLAG as a set signal and receives the signal reset signal RESTART as a reset signal. The RS latch may include a cross-coupled NAND latch.

Figure 12:
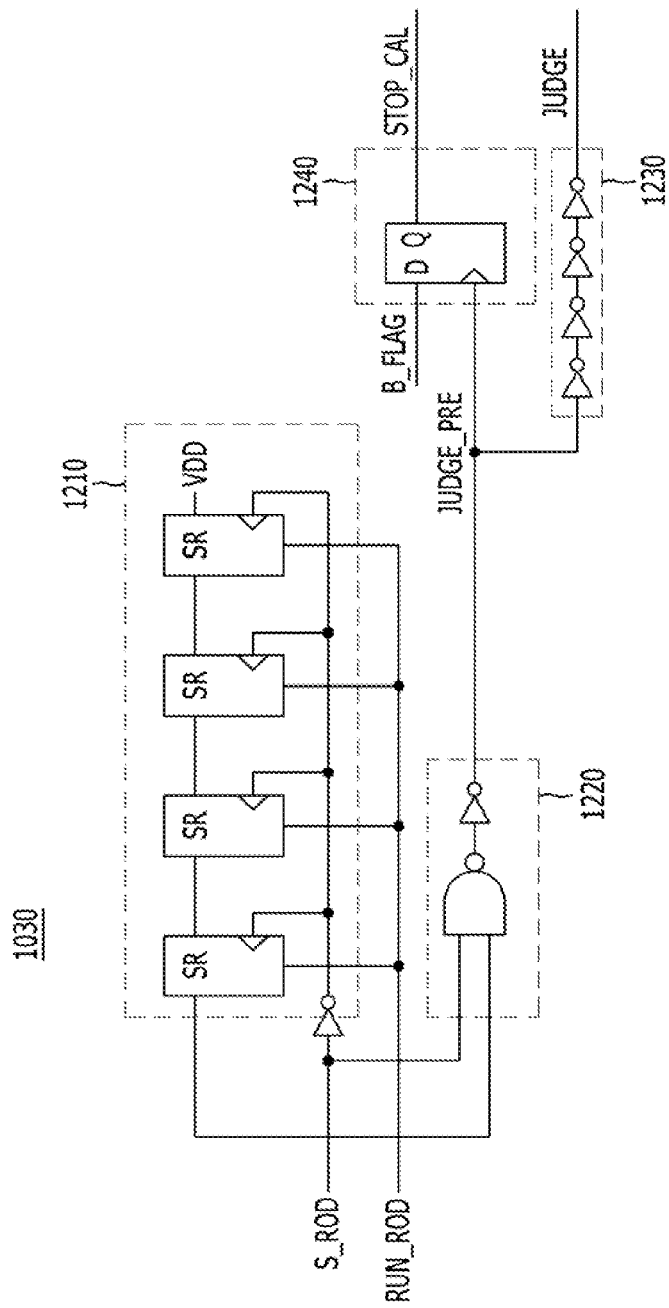
FIG. 12 is a detailed diagram of a counter detection unit shown in FIG. 10.

FIG. 12 is a detailed diagram of the counter detection unit 1030 shown in FIG. 10.

Referring to FIG. 12, the counter detection unit 1030 may include a counter 1210, a first judgment signal generation unit 1220, a second judgment signal generation unit 1230, and a detection signal generation unit 1240.

The counter 1210 may count the period of the short-term oscillation signal S_ROD. In an embodiment, the counter 1210 may include a plurality of shift registers SR coupled in series. The shift registers may sequentially transmit a high-level signal VDD in response to low edges of the short-term oscillation signal S_ROD. The shift registers may be reset in response to the operation start signal RUN_ROD.

The first judgment signal generation unit 1220 may output the short-term oscillation signal S_ROD as the first judgment signal JUDGE_PRE when the counting value reaches a predetermined value. In an embodiment, the first judgment signal generation unit 1220 may include a NAND gate and an Inverter, which perform an AND operation on the output signal of the counter 1210 and the short-term oscillation signal S_ROD.

The second judgment signal generation unit 1230 may generate the second judgment signal JUDGE by delaying the first judgment signal JUDGE_PRE. In an embodiment, the second judgment signal generation unit 1230 may include an inverter chain which delays the first judgment signal JUDGE_PRE by a predetermined time.

The detection signal generation unit 1240 may synchronize the flag signal B_FLAG with the first judgment signal JUDGE_PRE and output the synchronized signal as the detection signal STOP_CAL. In an embodiment, the detection signal generation unit 1240 may include a flip-flop.

Hereinafter, referring to FIGS. 10 to 13B, the operation of the calibration code generation circuit 100 will be described as follows.

Figure 13A:
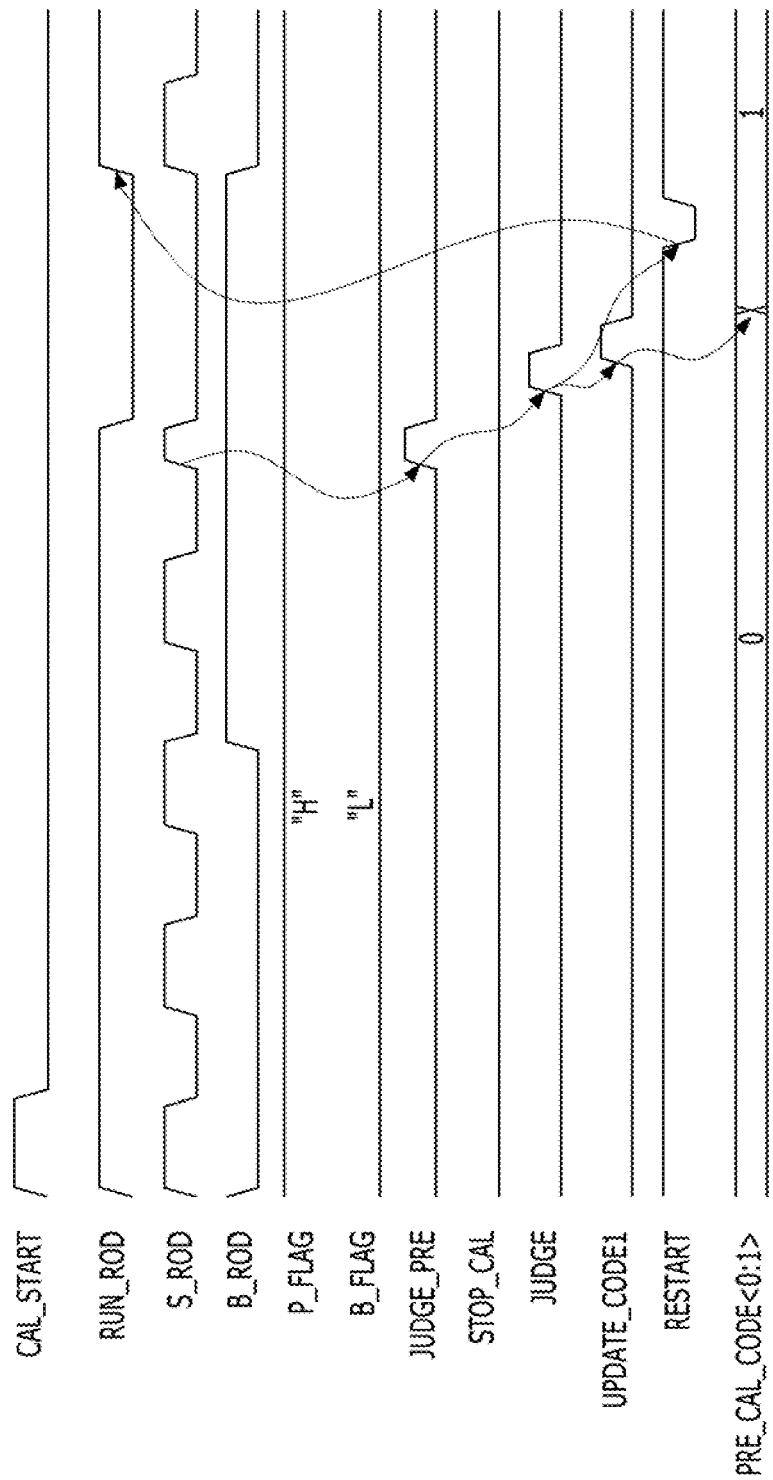
FIGS. 13A and 13B are waveform diagrams for describing an operation of the calibration code generation circuit shown in FIG. 10.
Figure 13B:
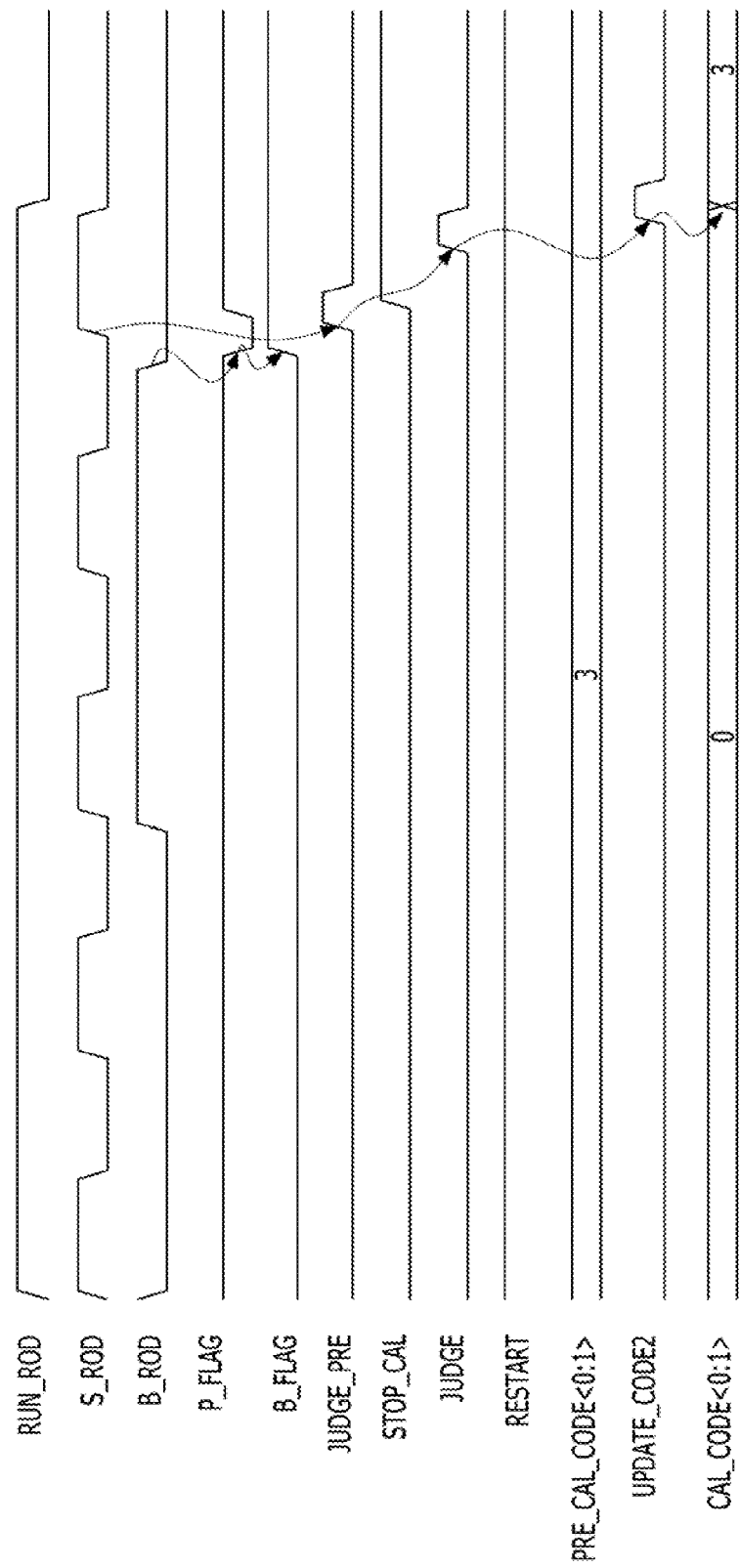

FIGS. 13A and 13B are waveform diagrams for describing an operation of the calibration code generation circuit 100 illustrated in FIG. 10. FIG. 13A illustrates that the reference period of the reference oscillation signal B_ROD is greater than the quadruple of the period of the short-term oscillation signal S_ROD, and FIG. 13B illustrates that the reference period is less than the quadruple of the period of the short-term oscillation signal S_ROD.

Referring to FIG. 13A, when the calibration start signal CAL_START is activated, the operation start signal RUN_ROD may be activated. In response to the operation start signal RUN_ROD, the reference oscillation signal B_ROD oscillating at the reference period may be outputted, and the short-term oscillation signal S_ROD oscillating at a period less than the reference period may be outputted.

The counter detection unit 1030 may count the period of the short-term oscillation signal S_ROD. When the counting value reaches a predetermined value, for example, four, the counter detection unit 1030 may activate the first judgment signal JUDGE_PRE in synchronization with the short-term oscillation signal S_ROD which becomes a logic high level. Furthermore, the counter detection unit 1030 may delay the first judgment signal JUDGE_PRE by a predetermined time, and activate the second judgment signal JUDGE.

The operation start signal RUN_ROD may be deactivated in response to the second judgment signal JUDGE. Thus, since the operation start signal RUN_ROD is already deactivated in response to the second judgment signal JUDGE, the signal latch unit 1020 may maintain the pre-flag signal P_FLAG at a logic high level, regardless of the reference period of the reference oscillation signal B_ROD. Thus, the flag signal B_FLAG may be maintained at a logic low level.

The counter detection unit 1030 may synchronize the flag signal B_FLAG with the first judgment signal JUDGE_PRE and output the synchronized signal as the detection signal STOP_CAL. In FIG. 13A, when the first judgment signal JUDGE_PRE toggles to a logic high level, the detection signal STOP_CAL may be outputted at a logic low level, because the flag signal B_FLAG maintains a logic low level.

Then, when the second judgment signal JUDGE is activated to a logic high level in a state where the detection signal STOP_CAL is deactivated to a logic low level, the first update signal UPDATE_CODE1 may be activated. The operation start signal RUN_ROD may be deactivated in response to the second judgment signal JUDGE. Thus, the counter 1210 of the counter detection unit 1030 may stop the counting operation. In response to the first update signal UPDATE_CODE1, the period control code PRE_CAL_CODE<0:1> may be outputted. Thus, the period of the short-term oscillation signal S_ROD may be adjusted.

When a predetermined time elapses after the first update signal UPDATE_CODE1 is activated, the count reset signal RESTART may be activated to a logic low level. Thus, the operation start signal RUN_ROD may be reactivated. The above-described process may be repeated until the reference period of the reference oscillation signal B_ROD becomes less than or equal to the quadruple of the period of the short-term oscillation signal S_ROD.

Referring to FIG. 13B, in response to the operation start signal RUN_ROD, the reference oscillation signal B_ROD oscillating at the reference period and the short-term oscillation signal S_ROD oscillating at a period less than the reference period may be outputted.

The signal latch unit 1020 may generate the pre-flag signal P_FLAG which is activated at each reference period of the reference oscillation signal B_ROD, and thus generate the flag signal B_FLAG.

The counter detection unit 1030 may count the period of the short-term oscillation signal S_ROD. When the counting value reaches a predetermined value, for example, four, the counter detection unit 1030 may activate the first judgment signal JUDGE_PRE in synchronization with the short-term oscillation signal S_ROD which becomes a logic high level. Furthermore, the counter detection unit 1030 may activate a second judgment signal JUDGE by delaying the first judgment signal JUDGE_PRE by a predetermined time. Then, the counter detection unit 1030 may synchronize the flag signal B_FLAG with the first judgment signal JUDGE_PRE, and output the synchronized signal as the detection signal STOP_CAL. In FIG. 13A, when the first judgment signal JUDGE_PRE toggles to a logic high level, the detection signal STOP_CAL may be outputted at a logic high level, because the flag signal B_FLAG already transitions to a logic high level.

Then, when the second judgment signal JUDGE is activated to a logic high level in a state where the detection signal STOP_CAL is activated to a logic high level, the second update signal UPDATE_CODE2 may be activated. The operation start signal RUN_ROD may be deactivated in response to the second judgment signal JUDGE. Thus, the counter 1210 of the counter detection unit 1030 may stop the counting operation. In response to the second update signal UPDATE_CODE2, the period control code PRE_CAL_CODE<0:1> which is finally generated may be outputted as the calibration code CAL_CODE<0:1>.

Using the calibration code CAL_CODE<0:1> outputted through the above-described process, the delay circuits 120 may set the internal delay values.

In accordance with the embodiments of the present invention, as the short-RC delay circuit is calibrated on the basis of the long-RC delay circuit, the short-RC delay circuit may be configured to have a skew corresponding to that of the long-RC delay circuit. Furthermore, the short-RC delay circuit occupying a relatively small area may be used to improve the efficiency of the circuit area of DRAM.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a calibration code generation circuit suitable for generating a calibration code by adjusting a period of a short-term oscillation signal oscillating at a period less than a reference period, based on a reference oscillation signal oscillating at the reference period; and
   a delay circuit suitable for setting a delay value based on the calibration code.

2. The semiconductor device of claim 1, wherein the delay circuit comprises an RC delay.

3. The semiconductor device of claim 1, wherein the calibration code generation circuit comprises:
   a reference oscillation signal generation unit suitable for generating the reference oscillation signal;
   a short-term oscillation signal generation unit suitable for generating the short-term oscillation signal, and adjusting the period of the short-term oscillation signal in response to a period control code; and
   a calibration operation adjust unit suitable for outputting the period control code and the calibration code in response to the reference oscillation signal and the short-term oscillation signal.

4. The semiconductor device of claim 3, wherein the reference oscillation signal generation unit and the short-term oscillation signal generation unit comprise a ring oscillator delay.

5. The semiconductor device of claim 3, wherein the calibration operation adjust unit outputs the period control code to the short-term oscillation signal generation unit when the reference period is greater than N times the period of the short-term oscillation signal, and outputs the calibration code to the delay circuit when the reference period is less than or equal to N times the period of the short-term oscillation signal.

6. The semiconductor device of claim 3, wherein the calibration operation adjust unit comprises:

a judgment signal generation unit suitable for generating a first judgment signal which is activated at each reference period of the reference oscillation signal, and generating a second judgment signal by delaying the first judgment signal;

a counter latch unit suitable for generating a count signal by counting the period of the short-term oscillation signal;

a detection unit suitable for outputting a detection signal by comparing the first judgment signal and the count signal; and a calibration control unit suitable for outputting the period control code and the calibration code in response to the second judgment signal and the detection signal.

7. The semiconductor device of claim 6, wherein the calibration control unit outputs a count reset signal for resetting the counter latch unit, when the second judgment signal is activated in a state where the detection signal is deactivated.

8. The semiconductor device of claim 7, wherein the counter latch unit comprises:
a counter suitable for counting the period of the short-term oscillation signal;
a transmission unit suitable for outputting the short-term oscillation signal when the counting value reaches a predetermined value; and
a latch unit suitable for outputting the count signal which is set by the output of the transmission unit and reset in response to the count reset signal.

9. The semiconductor device of claim 6, wherein the calibration control unit comprises:
an operation start signal generation unit suitable for generating an operation start signal for starting the operations of the reference oscillation signal generation unit and the short-term oscillation signal generation unit, activating the operation start signal in response to a calibration start signal and count reset signal, and deactivating the operation start signal in response to the second judgment signal;
a count reset signal generation unit suitable for generating the count reset signal for resetting the counter latch unit, when the second judgment signal is activated in a state where the detection signal is deactivated;
an update signal generation unit suitable for outputting a first update signal when the second judgment signal is activated in a state where the detection signal is deactivated, and outputting a second update signal when the second judgment signal is activated in a state where the detection signal is activated;
a first code output unit suitable for outputting the period control code in response to the first update code; and
a second code output unit suitable for outputting the calibration code in response to the second update signal.

10. The semiconductor device of claim 9, wherein the operation start signal generation unit comprises an RS latch.

11. The semiconductor device of claim 6, wherein the detection unit comprises a flip-flop which synchronizes the count signal with the first judgment signal and outputs the synchronized signal as the detection signal.

12. The semiconductor device of claim 6, wherein the judgment signal generation unit comprises:
a first judgment signal generation unit suitable for generating the first judgment signal which is activated at each reference period of the reference oscillation signal; and a second judgment signal generation unit suitable for generating two or more intermediate signals by sequentially delaying the first judgment signal, and generating the second judgment signal by delaying the final signal among the intermediate signals.

13. The semiconductor device of claim 12, wherein the detection unit comprises:
a first flip-flop suitable for outputting the count signal in synchronization with the first judgment signal; and
two or more second flip-flops coupled in series to each other, and suitable for outputting the second judgment signal by sequentially transmitting the output of the first flip-flip in synchronization with the intermediate signals.

14. The semiconductor device of claim 3, wherein the calibration operation adjust unit comprises:
a signal latch unit suitable for generating a flag signal which is activated at each reference period of the reference oscillation signal;
a counter detection unit suitable for counting the period of the short-term oscillation signal, generating a first judgment signal when the counting value reaches a predetermined value, generating a second judgment signal by delaying the first judgment signal, and outputting a detection signal in response to the second detection signal and the flag signal; and
a calibration control unit suitable for outputting the period control code and the calibration code in response to the second judgment signal and the detection signal.

15. The semiconductor device of claim 14, wherein the counter detection unit comprises:
a counter suitable for counting the period of the short-term oscillation signal;
a first judgment signal generation unit suitable for outputting the short-term oscillation signal as the first judgment signal when the counting value reaches the predetermined value;
a second judgment signal generation unit suitable for generating the second judgment signal by delaying the first judgment signal; and
a detection signal generation unit suitable for synchronizing the flag signal with the first judgment signal and outputting the synchronized signal as the detection signal.

16. An operating method of a semiconductor device including a delay circuit, comprising:
generating a reference oscillation signal having a reference period;
generating a short-term oscillation signal having a period less than the reference period;
outputting a period control code and a calibration code based on the reference oscillation signal and the short-term oscillation signal;
adjusting a period of the short-term oscillation signal based on the period control code; and
setting a delay value of the delay circuit based on the calibration code.

17. The operating method of claim 16, wherein the outputting of the period control code and the calibration code comprises outputting the period control code when the reference period is greater than N times the period of the short-term oscillation signal, and outputting the calibration code when the reference period is less than or equal to N times the period of the short-term oscillation signal.

18. The operating method of claim 16, wherein the outputting of the period control code and the calibration code comprises:

generating a first judgment signal which is activated at each reference period of the reference oscillation signal, and outputting a second judgment signal by delaying the first judgment signal;

generating a count signal by counting the period of the short-term oscillation signal;

outputting a detection signal by comparing the first judgment signal and the count signal; and outputting the period control code and the calibration code in response to the second judgment signal and the detection signal.

19. The operating method of claim 18, wherein the outputting of the period control code and the calibration code in response to the second judgment signal and the detection signal comprises:

outputting a first update signal when the second judgment signal is activated in a state where the detection signal is deactivated, and outputting a second update signal when the second judgment signal is activated in a state where the detection signal is activated;

outputting the period control code in response to the first update signal; and outputting the calibration code in response to the second update signal.

20. The operating method of claim 16, further comprising:

generating a flag signal which is activated at each reference period of the reference oscillation signal;

counting the period of the short-term oscillation signal, generating a first judgment signal when the counting value reaches a predetermined value, and generating a second judgment signal by delaying the first judgment signal;

outputting a detection signal in response to the second judgment signal and the flag signal; and outputting the period control code and the calibration code in response to the second judgment signal and the detection signal.

* * * * *